US011581036B2

(12) United States Patent
Bijivemula et al.

(10) Patent No.: US 11,581,036 B2
(45) Date of Patent: Feb. 14, 2023

(54) SEARCHABLE ARRAY CIRCUITS WITH LOAD-MATCHED SIGNALS FOR REDUCED HIT SIGNAL TIMING MARGINS AND RELATED METHODS

(71) Applicant: Microsoft Technology Licensing, LLC, Redmond, WA (US)

(72) Inventors: Sai Prakash Reddy Bijivemula, Raleigh, NC (US); Rajesh Kumar, Apex, NC (US)

(73) Assignee: Microsoft Technology Licensing, LLC, Redmond, WA (US)

(*) Notice: Subject to any disclaimer, the term of this patent is extended or adjusted under 35 U.S.C. 154(b) by 43 days.

(21) Appl. No.: 17/249,464

(22) Filed: Mar. 2, 2021

(65) Prior Publication Data

US 2022/0284945 A1    Sep. 8, 2022

(51) Int. Cl.
| | | |
|---|---|---|
| *G11C 11/408* | (2006.01) | |
| *G11C 11/413* | (2006.01) | |
| *G11C 15/00* | (2006.01) | |
| *G11C 15/04* | (2006.01) | |
| *H03K 19/017* | (2006.01) | |

(Continued)

(52) U.S. Cl.
CPC .......... *G11C 11/413* (2013.01); *G11C 11/412* (2013.01); *G11C 11/417* (2013.01); *G11C 15/00* (2013.01); *G11C 15/04* (2013.01); *H03K 19/01742* (2013.01)

(58) Field of Classification Search
CPC ................................ G11C 15/00; G11C 15/04
See application file for complete search history.

(56) References Cited

U.S. PATENT DOCUMENTS

| 6,041,389 A * | 3/2000 | Rao ........................ G11C 15/04 |
| | | 711/3 |
| 7,113,415 B1 * | 9/2006 | Khanna .................. G11C 15/04 |
| | | 365/49.16 |

(Continued)

FOREIGN PATENT DOCUMENTS

JP        H07282586 A      10/1995

OTHER PUBLICATIONS

JPH07282586A English Translation, Naoshi, 1995 (Year: 1995).*

(Continued)

*Primary Examiner* — Mushfique Siddique
(74) *Attorney, Agent, or Firm* — Withrow & Terranova, PLLC

(57) ABSTRACT

A CAM array of compare memory cell circuits includes a decode column corresponding to each set, and each set includes at least one row of the compare memory cell circuits. Each decode column receives a set clock signal addressing the corresponding set and generates a set match signal in each row of the corresponding set. A column compare circuit generates compare data indicating a bit of a compare tag. A row match circuit generates, for each row, in response to the set match signal, a row match signal indicating the compare tag matches the binary tag stored in the row. Circuits and loads in a decode column employed to generate the set clock signal correspond to circuits generating the row match signal in each column of the CAM array to reduce a timing margin of the match indication and decrease the access time for the CAM array.

38 Claims, 10 Drawing Sheets

(51) Int. Cl.
*G11C 11/412* (2006.01)
*G11C 11/417* (2006.01)

(56) References Cited

U.S. PATENT DOCUMENTS

| | | | |
|---|---|---|---|
| 7,230,841 B1 * | 6/2007 | Srinivasan | G11C 15/04 711/108 |
| 2003/0137890 A1 | 7/2003 | Vlasenko et al. | |
| 2009/0141528 A1 | 6/2009 | Arsovski et al. | |

OTHER PUBLICATIONS

"International Search Report and Written Opinion Issued in PCT Application No. PCT/US22/017124", dated Jul. 11, 2022, 10 Pages. (MS# 409230-WO-PCT).

* cited by examiner

US 11,581,036 B2

SEARCHABLE ARRAY CIRCUITS WITH LOAD-MATCHED SIGNALS FOR REDUCED HIT SIGNAL TIMING MARGINS AND RELATED METHODS

FIELD OF THE DISCLOSURE

The technology of the disclosure relates to memory arrays and more particularly to content-addressable random-access memory (CAM-RAM) arrays.

BACKGROUND

Computers and electronic devices process information that is stored in a binary form. Many different technologies exist for storing binary data. The technology selected for storing binary data in a particular situation depends on a variety of factors, including the amount of time the binary data must be stored, the frequency of accessing the binary data, whether the data must be saved in the absence of a power source, and the speed with which the binary data must be accessed by a processing element. Binary data can be stored in an array of memory cell circuits on an integrated circuit (IC). An array includes rows and columns of memory cell circuits efficiently arranged on a semiconductor substrate. If the storage location of desired binary data in a random-access memory (RAM) is known, a processor can access the binary information by identifying the row and column.

In some circumstances, rather than tracking the row and column information, the location of binary data can be tracked by an identifier, often referred to as a tag, based on the binary data itself. The location of desired binary data can be found by locating the corresponding identifier. The identifier may be made up of some bits of the binary data or a binary pattern can be generated using an algorithm with the binary data as an input. The identifier is stored in a location corresponding to the binary data such that, if the identifier is found, the location of the binary data can be determined. In an exhaustive random-access method, every identifier in an array could be read out and compared to a known identifier of desired binary data. However, the time required for such approach would significantly increases the time for the processor to access the desired binary. Alternatively, a content-addressable memory (CAM) has the capability to compare the known identifier of the desired binary data to all the identifiers stored in the array. The location of the desired binary data can be determined when a matching identifier is found. While this approach is faster than an exhaustive method, it would be desirable to minimize the time required for comparing the known identifier to the identifiers (tags) within the array to further minimize the data access time of the CAM array.

SUMMARY

Exemplary aspects disclosed herein include searchable array circuits with load-matched signals for reduced hit signal timing margins. A content-addressable memory (CAM) includes compare memory cell circuits in columns and rows storing bits of binary tags. Triggered by a clock signal, a compare tag is compared to binary tags stored in each row of a CAM array to determine in which row, if any, a binary tag matching the compare tag is stored. A compare bit signal indicating a compare bit of the compare tag is provided to each column of compare memory cell circuits for comparison to corresponding bits of binary tags stored in each row. A hit signal, also referred to herein as a row match signal, is an indication of a compare tag matching a binary tag in a row based on comparisons in each column.

In an exemplary aspect, a CAM array includes at least one decode column, each decode column corresponding to a set, where each set includes at least one row of the compare memory cell circuits. Each decode column receives a set clock signal for addressing the corresponding set and generates a set match signal in each row of the corresponding set. A column compare circuit generates, in each column, compare true data and compare complement data indicating a bit of a compare tag. A row match circuit generates, for each row, in response to the set match signal, a row match signal indicating that the compare tag matches the binary tag stored in the row. In one example, each row may include a row match line and the row match circuit may generate the row match signal for the row in response to the row match line indicating the compare tag matches the binary tag in the row. Thus, the row match signal is generated in response to both the set clock signal and the row match line, which are both triggered by a clock signal. A difference in timing of activation of the set clock signal and the indication of a compare tag match on the row match line depends on differences in propagation delays, which are affected by manufacturing process variations in the respective circuits and numbers of loads on the respective circuits. In an exemplary aspect, circuits employed to generate the set clock signal and loads thereon in a decode column correspond to circuits generating the row match signal in each column of the CAM array. Such correspondence reduces the timing margin of a match indication and, thereby, decreases the access time for the CAM array.

In exemplary aspects, an array of compare memory cell circuits is disclosed. The array of compare memory cell circuits includes at least one set, each set comprising at least one row of a plurality of rows of compare memory cell circuits, and each row of the plurality of rows configured to store a binary tag. The array of compare memory cell circuits includes a plurality of columns of the compare memory cell circuits, each column of the plurality of columns comprising a compare memory cell circuit in each row of the plurality of rows. The array of compare memory cell circuits includes at least one decode column, each of the at least one decode column corresponding to a set of the at least one set, the at least one decode column configured to receive a set clock signal for the corresponding set and generate a set match signal on a set match line in each row of the corresponding set. The array of compare memory cell circuits includes a dynamic comparator circuit comprising a set clock circuit, a column compare circuit, and a row match circuit. The set clock circuit is configured to generate, to each of the at least one decode column, the set clock signal for addressing the corresponding set. The column compare circuit configured to generate, for each column of the plurality of columns, a compare true data indicating a compare true bit of a compare tag. The row match circuit is configured to generate, for each row of the plurality of rows, in response to the set match signal generated in the row, a row match signal indicating that the compare tag matches the binary tag stored in the row.

In another exemplary aspect, an integrated circuit comprising an array of compare memory cell circuits is disclosed. The array of compare memory cell circuits includes at least one set, each set comprising at least one row of a plurality of rows of compare memory cell circuits, and each row of the plurality of rows configured to store a binary tag. The array of compare memory cell circuits includes a plurality of columns of the compare memory cell circuits, each column of the plurality of columns comprising a compare memory cell circuit in each row of the plurality of rows. The array of compare memory cell circuits includes at least one decode column, each of the at least one decode column corresponding to a set of the at least one set, the at least one decode column configured to receive a set clock signal for the corresponding set and generate a set match signal on a set match line in each row of the corresponding set. The array of compare memory cell circuits includes a dynamic comparator circuit comprising a set clock circuit, a column compare circuit, and a row match circuit. The set clock circuit is configured to generate, to each of the at least one decode column, the set clock signal for addressing the corresponding set. The column compare circuit configured to generate, for each column of the plurality of columns, a compare true data indicating a compare true bit of a compare tag. The row match circuit is configured to generate, for each row of the plurality of rows, in response to the set match signal generated in the row, a row match signal indicating that the compare tag matches the binary tag stored in the row.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
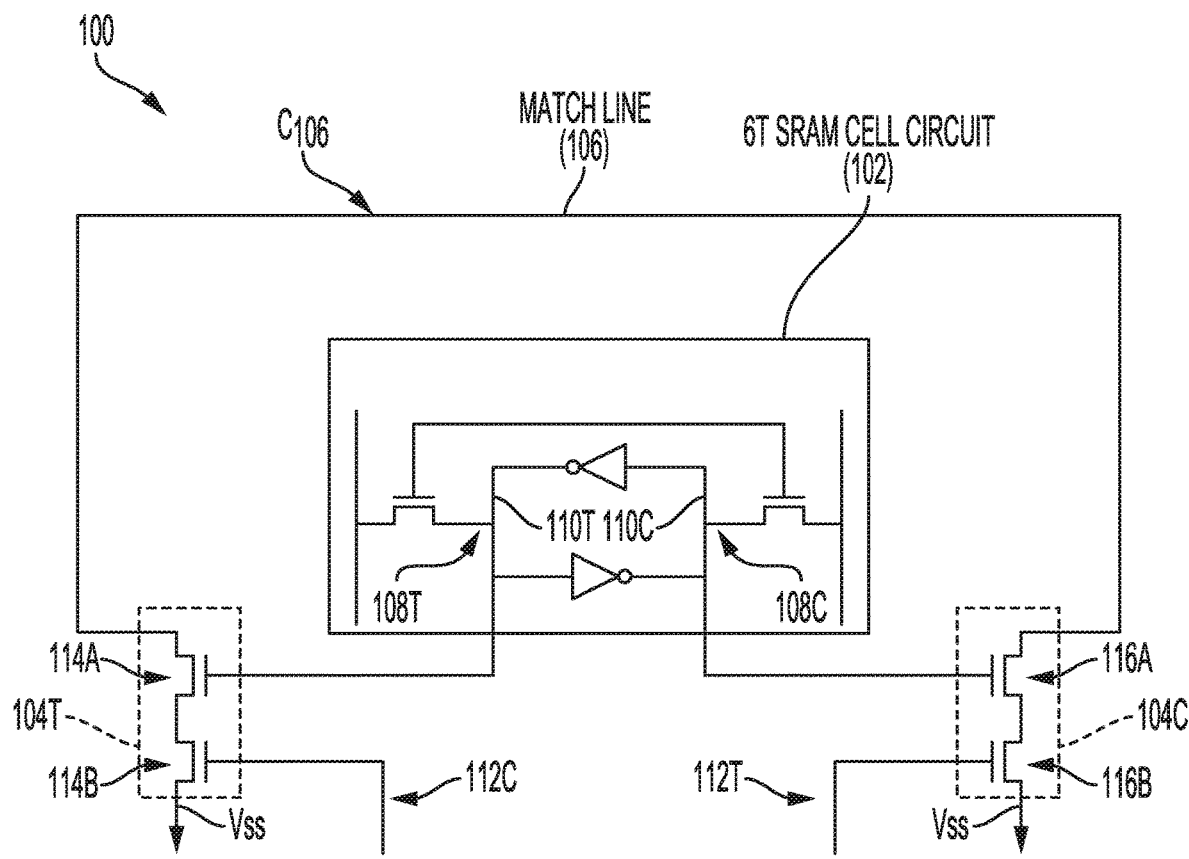
FIG. 1 is a schematic diagram of compare memory cell circuit including a six (6) transistor (6T) static random-access memory (SRAM) cell circuit and true and complement compare circuits coupled to a match line, as employed in a content-addressable memory (CAM) array.

Exemplary aspects disclosed herein include searchable array circuits with load-matched signals for reduced hit signal timing margins. A content-addressable memory (CAM) includes compare memory cell circuits in columns and rows storing bits of binary tags. Triggered by a clock signal, a compare tag is compared to binary tags stored in each row of a CAM array to determine in which row, if any, a binary tag matching the compare tag is stored. A compare bit signal indicating a compare bit of the compare tag is provided to each column of compare memory cell circuits for comparison to corresponding bits of binary tags stored in each row. A hit signal, also referred to herein as a row match signal, is an indication of a compare tag matching a binary tag in a row based on comparisons in each column.

In an exemplary aspect, a CAM array includes at least one decode column, each decode column corresponding to a set, where each set includes at least one row of the compare memory cell circuits. Each decode column receives a set clock signal for addressing the corresponding set and generates a set match signal in each row of the corresponding set. A column compare circuit generates, in each column, compare true data and compare complement data indicating a bit of a compare tag. A row match circuit generates, for each row, in response to the set match signal, a row match signal indicating that the compare tag matches the binary tag stored in the row. In one example, each row may include a row match line and the row match circuit may generate the row match signal for the row in response to the row match line indicating the compare tag matches the binary tag in the row. Thus, the row match signal is generated in response to both the set clock signal and the row match line, which are both triggered by a clock signal. A difference in timing of activation of the set clock signal and the indication of a compare tag match on the row match line depends on differences in propagation delays, which are affected by manufacturing process variations in the respective circuits and numbers of loads on the respective circuits. In an exemplary aspect, circuits employed to generate the set clock signal and loads thereon in a decode column correspond to circuits generating the row match signal in each column of the CAM array. Such correspondence reduces the timing margin of a match indication and, thereby, decreases the access time for the CAM array.

Before describing exemplary aspects of the content-addressable memory (CAM) array illustrated in FIGS. 5-9, existing CAM array circuits and operation thereof are first discussed with reference to FIGS. 1-4. A CAM array is configured to compare a compare bit pattern (compare tag) known, e.g., to a processor, to bit patterns (binary tags) stored in the CAM array. The location of a binary tag matching the compare tag indicates a location at which the desired data, corresponding to the compare tag, is stored. In order to minimize the time to access the desired binary data in a CAM array, the time to compare the compare tag to all the binary tags and generate a match indication must be minimized.

FIG. 1 is a schematic diagram of a compare memory cell circuit 100 that could be employed for storing a bit of a binary tag in a CAM array (not shown). The compare memory cell circuit 100 includes a six (6) transistor (6T)

static random-access memory cell circuit 102. The compare memory cell circuit 100 also includes a true compare circuit 104T and a complement compare circuit 104C coupled to a match line 106. The true compare circuit 104T and the complement compare circuit 104C are employed for comparing the true data 108T in the true data node 110T and complement data 108C in the complement data node 110C, respectively, to a compare true data 112T and compare complement data 112C. The complement data 108C is complementary (e.g., opposite) to the true data 108T. A result of the comparison is indicated on the match line 106.

In operation, the match line 106 is precharged to the supply voltage ($V_{DD}$) by a precharge circuit (not shown). A transistor 114A in the true compare circuit 104T is coupled to the true data node 110T and is turned on by the true data node 110T being at the supply voltage ($V_{DD}$), which corresponds to the true data 108T being a binary "1", for example. In this example, the true data 108T being a binary "0" corresponds to the true data node 110T being at ground voltage ($V_{SS}$) (e.g., 0 volts). The transistor 114B in the true compare circuit is turned on by the compare complement data 112C being a binary "1" (voltage $V_{DD}$). Therefore, if there is a mismatch between the true data 108T and the compare true data 112T, such that the true data 108T and the compare complement data 112C are both a binary "1", both of the transistors 114A and 114B will be turned on and the match line 106 will be discharged to the ground voltage $V_{SS}$, indicating the mismatch. The match line 106 is a wire or conductive element coupled to the transistor 114A and a transistor 116A.

Similarly, the transistor 116A in the complement compare circuit 104C is coupled to the complement data node 110C and turned on by the complement data 108C being a binary "1". The transistor 116B in the complement compare circuit is turned on by the compare true data 112T being a binary "1". Therefore, if there is a mismatch between the true data 108T and the compare true data 112T, such that the complement data 108C and the compare true data 112T are both binary "1", both of the transistors 116A and 116B will be turned on and the match line 106 will be discharged to the ground voltage $V_{SS}$. Thus, the match line 106 in a discharged state (e.g., 0 volts) indicates a mismatch between the true data 108T and the compare true data 112T regardless of polarity of the true data 108T. In a CAM array (not shown), the match line 106 may be shared among a plurality of compare memory cell circuits 100 storing bits of a binary tag. The match line 106 will remain charged to indicate that all bits of the binary tag stored in the CAM array match the corresponding bits of the compare tag. A time to discharge the match line 106 depends on a capacitance $C_{106}$ of the match line 106 and a current flowing through the true compare circuit 104T or the complement compare circuit 104C. The capacitance $C_{106}$ is determined, in part, by a length of the match line 106 and a number of loads, such as transistors to which the match line 106 is coupled or electrically connected.

Figure 2:
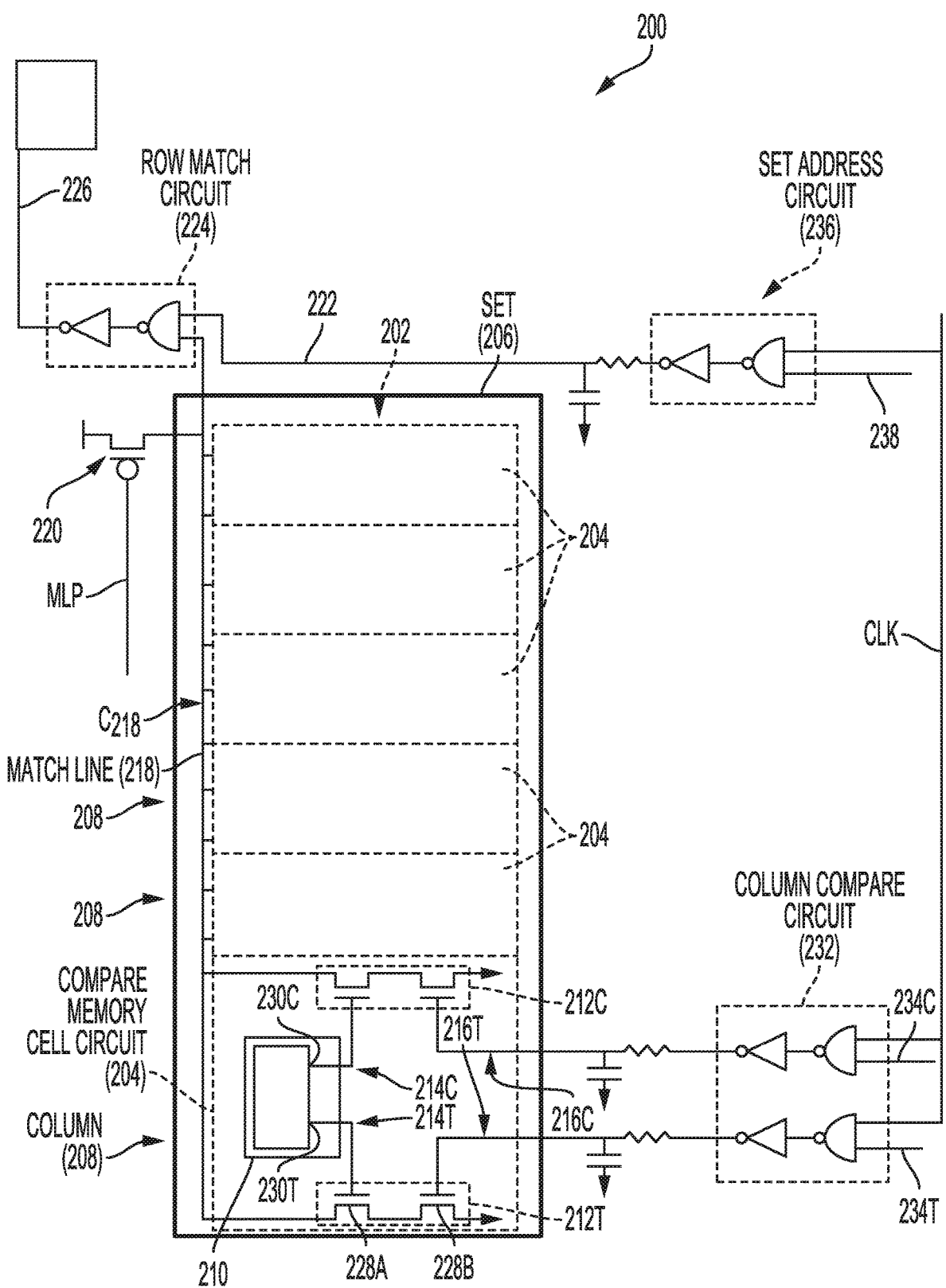
FIG. 2 is a schematic diagram of a CAM array including the 6T SRAM cell circuit as shown in FIG. 1 in a row of memory cell circuits.

FIG. 2 is a schematic diagram of CAM array 200 including a row 202 of compare memory cell circuits 204 that each correspond to the compare memory cell circuit 100 in FIG. 1. The CAM array 200 in FIG. 2 includes only one set 206 and the set 206 includes only the row 202, but the CAM array 200 could include a plurality of the rows 202 in the set 206 and/or a plurality of the sets 206, each with at least one of the rows 202. The row 202 includes six (6) compare memory cell circuits 204 but more or less compare memory cell circuits 204 could be included in a row 202, depending on a number of bits in a binary tag BT stored in the row 202.

The details of one of the compare memory cell circuits 204 are shown for reference. Each compare memory cell circuit 204 corresponds to a column 208 of the CAM array 200. Thus, any additional rows 202 in the CAM array 200 would include compare memory cell circuits 204 in each of the columns 208.

The compare memory cell circuit 204 includes a memory cell circuit 210 that may be the 6T SRAM cell circuit 102 of FIG. 1 or another type of memory cell circuit. The compare memory cell circuit 204 includes a true compare circuit 212T corresponding to the true compare circuit 104T in FIG. 1, and a complement compare circuit 212C corresponding to the complement compare circuit 104C. The true and complement compare circuits 212T and 212C compare a true data 214T stored in the compare memory cell circuit 204 to a compare true data 216T and a complement data 214C stored in the compare memory cell circuit 204 is compared to a compare complement data 216C. The true data 214T and complement data 214C indicate one bit of the binary tag BT stored in the row 202. The compare true data 216T and the compare complement data 216C indicate one bit of a compare tag CT corresponding to data a processor is accessing. If the compare tag CT matches one of the binary tags BT stored in the CAM array 200, data corresponding to the binary tag BT can be accessed in the CAM array 200.

Each compare memory cell circuit 204 is coupled to the match line 218. The match line 218 is precharged by a precharge circuit 220 controlled by a match line precharge signal MLP. The match line 218 is discharged (i.e., pulled-down) if there is a mismatch detected in any compare memory cell circuit 204 in the row 202. The match line 218 and a set clock signal 222 are received in a row match circuit 224. The set clock signal 222 indicates that the row 202 in the set 206 (and any other rows 202 in the set 206) are the target of the comparison to the compare tag CT. If the set clock signal 222 is active, the state of the match line 218 determines whether a hit signal 226 is activated to indicate that the compare tag CT matches the binary tag BT stored in the row 202. Each of the rows 202 in the CAM array 200 include the one of the row match circuits 224.

Returning to the compare memory cell circuit 204, a transistor 228A of the true compare circuit 212T is coupled to a true data node 230T that stores the true data 214T in the memory cell circuit 210. A transistor 228B of the true compare circuit 212T receives the compare complement data 216C. If both of the true data node 230T and the compare complement data 216C are at the supply voltage $V_{DD}$, indicating a mismatch, both of the transistor 228A and the transistor 228B are turned on and the true compare circuit 212T discharges the match line 218. Alternatively, the complement compare circuit 212C discharges the match line 218 if a complement data node 230C of the memory cell circuit 210 and a compare true data 216T are both at the supply voltage $V_{DD}$.

A column compare circuit 232 receives a compare true bit 234T and a compare complement bit 234C which are true and complement values of a corresponding bit of the compare tag CT. The column compare circuit 232 generates the compare true data 216T and compare complement data 216C based on the compare true bit 234T and a compare complement bit 234C, respectively. The compare true data 216T and the compare complement data 216C remain at the ground voltage $V_{SS}$ until activation by a clock signal CLK. When the clock signal CLK is activated, one of the compare true data 216T and the compare complement data 216C is driven to the supply voltage $V_{DD}$ depending on the values of the compare true bit 234T and the compare complement bit 234C. If the true data 214T does not match the compare true data 216T, one of the true and complement compare circuits 212T and 212C discharges the match line 218. Similar comparisons are performed in the other compare memory cell circuits 204 in every column 208 in the row 202 and any one of the compare memory cell circuits 204 may discharge the match line 218.

The set clock signal 222 is generated by a set address circuit 236 and is activated by the clock signal CLK to address the corresponding set 206. The set address circuit 236 receives a set address signal 238 in an active state to indicate that the set 206 is being addressed. The set address circuit 236 activates the set clock signal 222 when the set address signal 238 is active and the clock signal CLK is activated.

Since both the set clock signal 222 and the match line 218 contribute to the hit signal 226 and both are activated in response to the CLK signal, the state of the hit signal 226 is indicated in a timing margin after the activation of the CLK signal. The timing margin depends on a propagation delay of the set address signal 238 prior to arriving at the set address circuit 236 and through the set address circuit 236 in response to the clock signal CLK. The timing margin also depends on the time for discharging the match line 218 through one or more of the compare memory cell circuits 204 in the row 202. The time required to discharge the match line 218 after activation of the clock signal CLK depends on a propagation delay through the column compare circuit 232 and a number of loads on the compare true data 216T and the compare complement data 216C. The number of loads on the compare true data 216T and the compare complement data 216C depends on a number of rows 202 in the CAM array 200. In addition, the time to discharge the match line 218 depends on a total capacitance $C_{218}$ of the match line 218, which depends on a number of compare memory cell circuits 204 to which the match line 218 is coupled in the row 202 (i.e., bits in the binary tag BT).

It should be apparent that the propagation delay through the set address circuit 236 is typically much shorter in duration than the time to discharge the match line 218. The circuit path from the column compare circuit 232 and the match line 218 is more complex than the path through the set address circuit 236. In addition, such propagation timing can be affected by manufacturing process variations, causing timing uncertainty that increases the timing margin for generating the indication of a match or mismatch on the hit signal 226.

It would be desirable to reduce any propagation timing disparity between the circuit path from the set clock signal 222 to the hit signal 226 and the circuit paths from the compare true bit 234T and compare complement bit 234C to the hit signal 226. Reducing such disparity would make it possible to reduce the timing margin for the hit signal 226, which in turn reduces access time of the CAM array 200.

Figure 3:
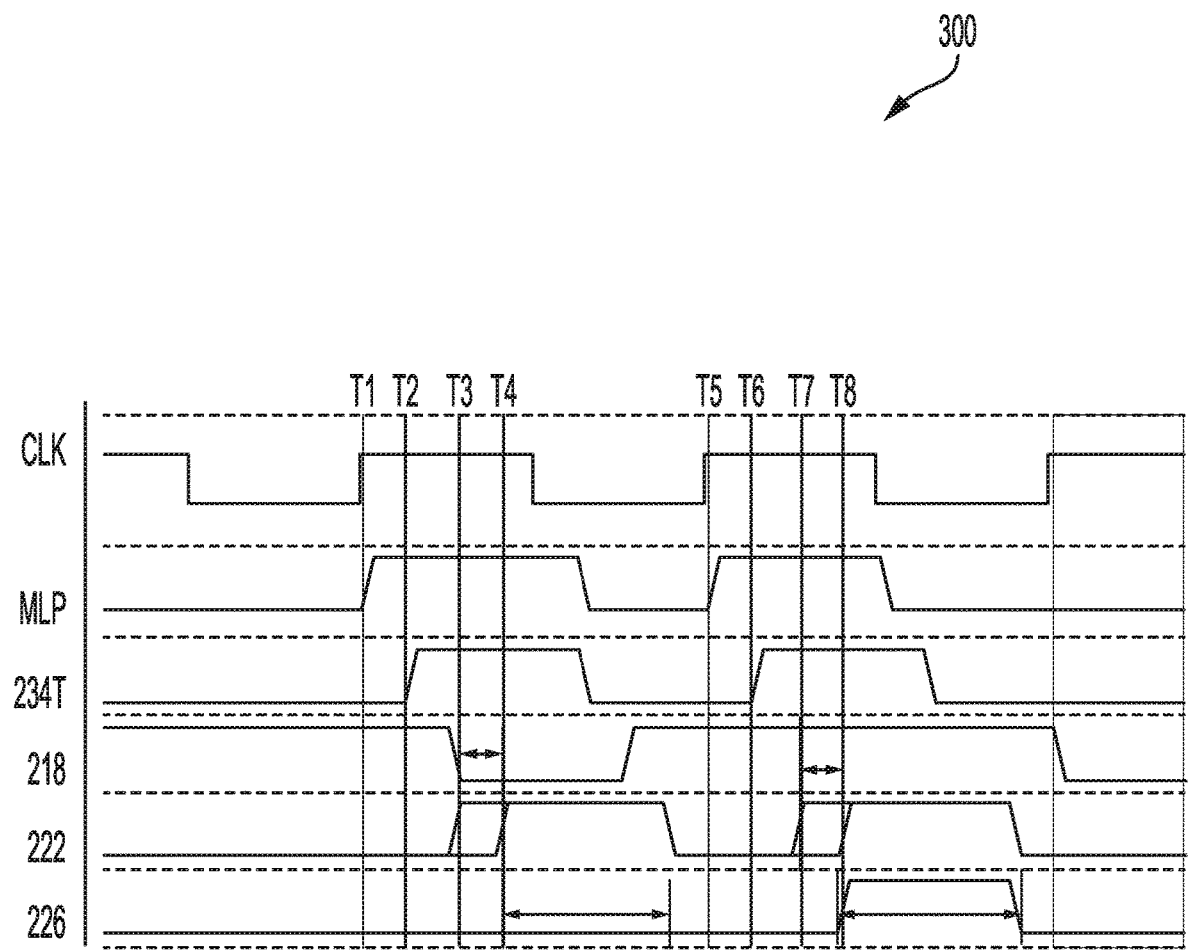
FIG. 3 is a timing diagram illustrating a timing margin of a set clock used to generate a hit signal indicating that a compare tag matches a binary tag stored in a row of the CAM array of FIG. 2, where the timing margin depends on process variations.

FIG. 3 is a timing diagram 300 illustrating signals in the CAM array 200, including a timing margin of the set clock signal 222 used to generate a hit signal in response to an indication on the match line 218 that the compare tag CT does or does not match a binary tag BT in the CAM array of FIG. 2.

The clock signal CLK in this example is a square wave with a 50% duty cycle but the duty cycle could be longer or shorter. A match line precharge signal MLP controlling the precharge circuit 220, which is low-active, is deactivated at time T1 in response to activation of the clock signal CLK. The compare true bit 234T and compare complement bit 234C are provided to the column compare circuit 232 at time T2. In the case of a mismatch, the match line 218 is discharged in a timing margin between a time T3 and a time T4. The hit signal 226 is valid after time T4. At time T5 the clock signal CLK is activated again and the compare true bit 234T and compare complement bit 234C are again provided to the column compare circuit 232 at time T6. In the case of a match, the match line 218 is not discharged but, because the match line 218 could be discharged anytime in the timing margin between time T7 and time T8 in a mismatch, the match line 218 being in the charged state does not reliably indicate a match until after time T8. Thus, it would be desirable to reduce the timing margins to reduce access time of the CAM array 200 in FIG. 2, because reducing the time it takes for a processor to access the CAM array 200 would make it possible to increase the speed of the processor for higher performance of an electronic device or application.

Figure 4:
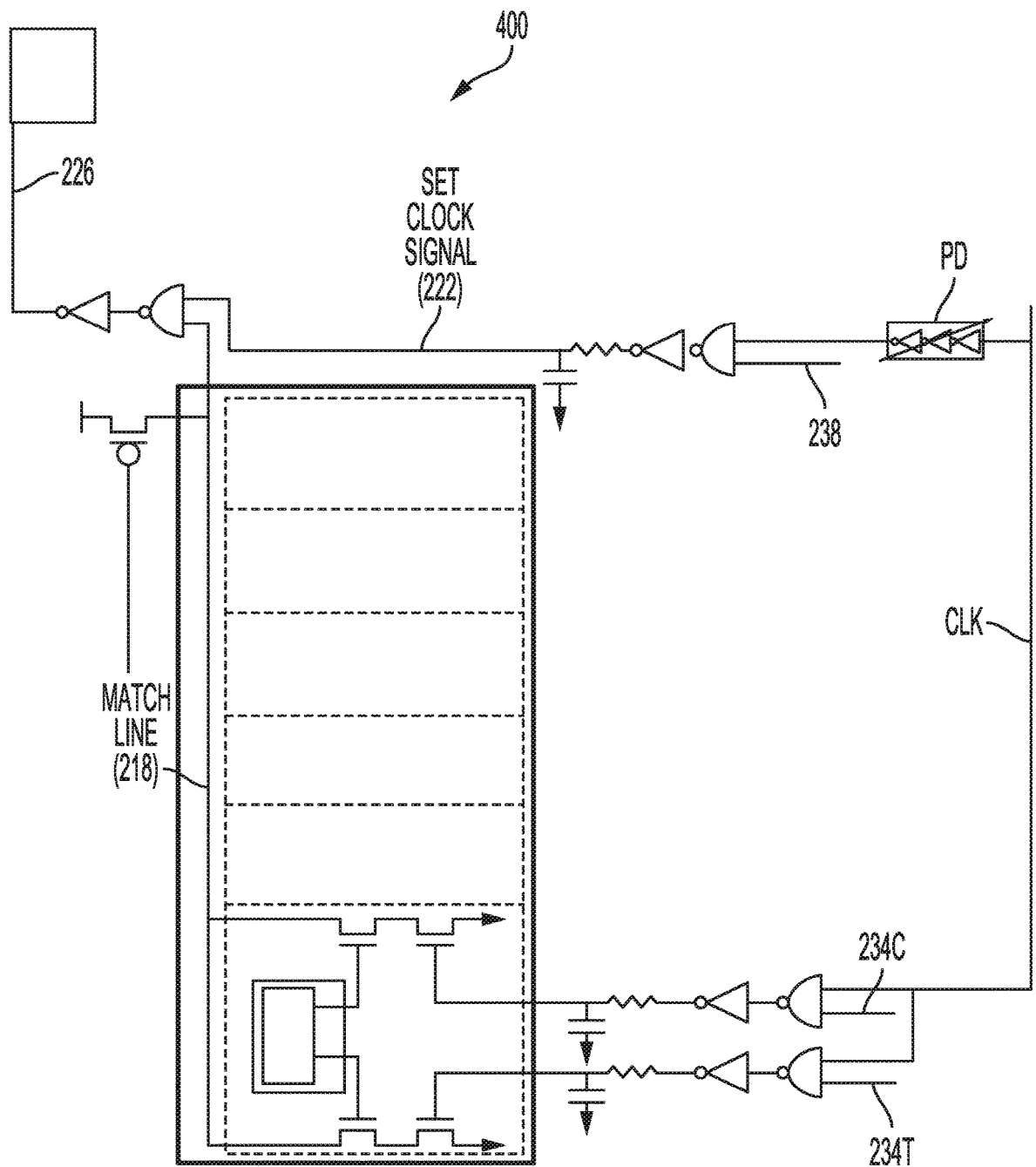
FIG. 4 is a schematic diagram of a CAM array like the CAM array in FIG. 2 with a programmable delay in the clock signal to adjust for process variation to reduce the timing margin.

FIG. 4 is a schematic diagram of a CAM array 400 like the CAM array 200 in FIG. 2. In an example of a technique for reducing the timing margin, the CAM array 400 includes a programmable delay PD in the clock signal CLK to adjust the timing of the set clock signal 222 to be better synchronized with the discharge time of the match line 218. The programmable delay PD can add delay to the clock signal CLK to delay the set clock signal 222 to adjust for manufacturing process variation. Employing the programmable delay PD requires a calibration step in each integrated circuit in which the CAM array 400 is manufactured. A CAM array in which a circuit path from the set address signal 238 to the hit signal 226 and the circuit path from the compare true bit 234T (or compare complement bit 234C) to the hit signal 226 are more closely synchronized (e.g., have a smaller timing margin) without a calibration step would be desirable.

Figure 5:
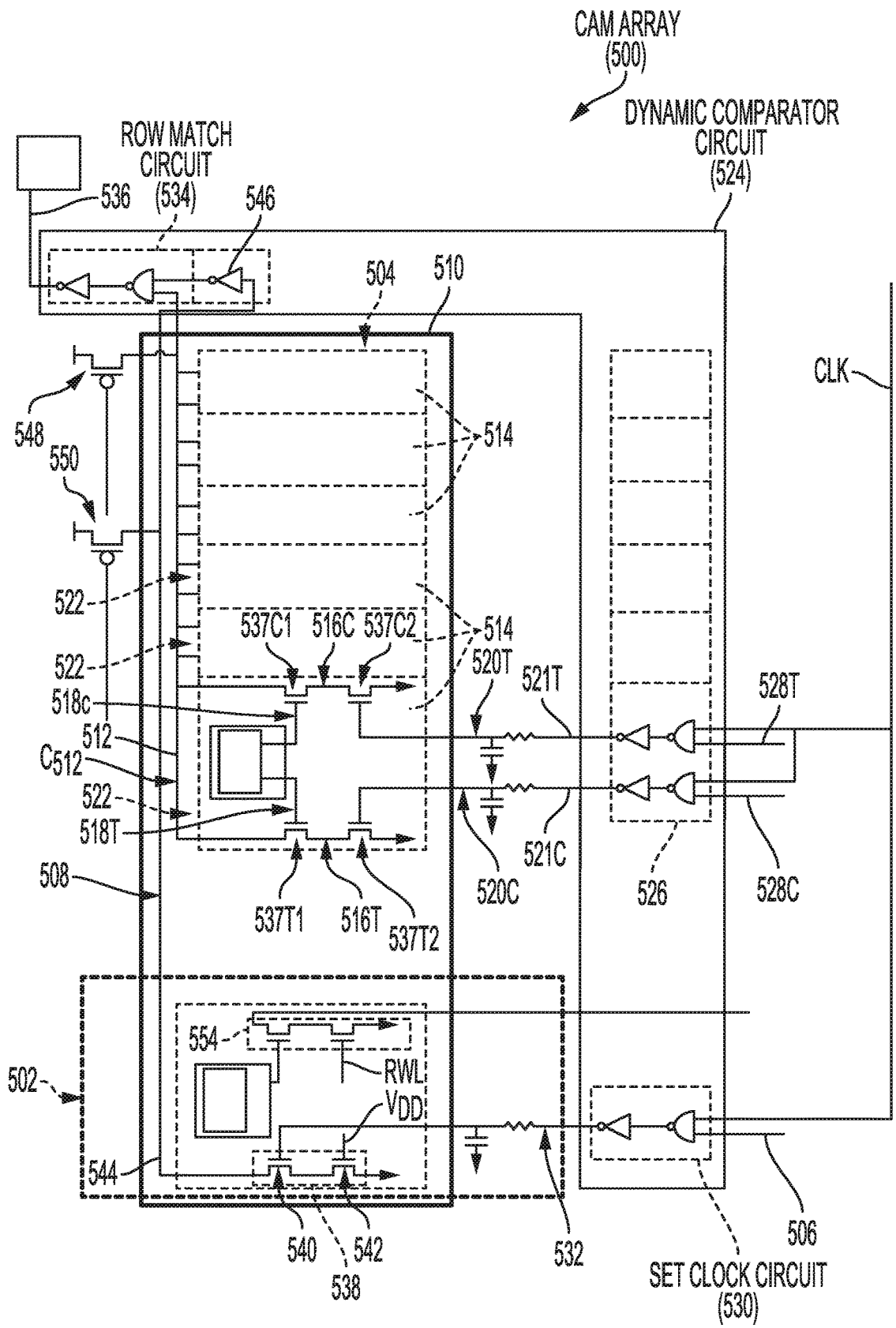
FIG. 5 is a schematic diagram of an exemplary CAM array including a decode column corresponding to each set for receiving a set clock signal and generating a set match signal and generating a hit signal indicating a match with a reduced timing margin.

FIG. 5 is a schematic diagram illustrating an exemplary CAM array 500 including a decode column 502 corresponding to each set 504. The CAM array 500 in FIG. 5 includes only one set 504 and, therefore, one decode column 502 but could include a plurality of sets 504. The decode column 502 receives a set address signal 506 and generates a set match signal 508 in each row 510 of each set 504 such that the set match signal 508 and a match indication on a row match line 512 are generated within a reduced timing margin. FIG. 5 shows the decode column 502 corresponding to a single row 510 in the set 504. Before explaining how the decode column 502 reduces the timing margin, a detailed explanation of a compare memory cell circuit 514 is first provided.

The CAM array 500 corresponds in function to the CAM array 200 in FIG. 2. The row 510 includes a plurality of the compare memory cell circuits 514 corresponding to the compare memory cell circuits 204 in the row 202 in FIG. 2. The CAM array 500 may include additional sets 504 that each include one or more rows 510. The compare memory cell circuits 514 each include a true compare circuit 516T and a complement compare circuit 516C that discharge the row match line 512 in response to a mismatch between a stored true data 518T stored in the compare memory cell circuit 514 and a compare true data 520T provided to the CAM array 500. The complement compare circuit 516C is coupled to the row match line 512 and discharges the row match line 512 in response to a mismatch between a stored complement data 518C stored in the compare memory cell circuit 514 and a compare complement data 520C provided to the CAM array 500.

The CAM array 500 receives the compare true data 520T and the compare complement data 520C on a true compare bit line 521T and a complement compare bit line 521C, respectively. The true compare circuit 516T in a compare memory cell circuit 514 is coupled to the row match line 512 of the row 510 that includes the compare memory cell circuit 514 and couples the row match line 512 to a fixed voltage, such as the ground voltage $V_{SS}$. The true compare circuit 516T is controlled by the stored true data 518T and the compare complement data 520C on the complement compare bit line 521T. The row match line 512 is a wire, metal trace, or other conductive element coupled to the true compare circuit 516T and the complement compare circuit 516C. The true compare circuit 516T couples the row match line 512 to the ground voltage $V_{SS}$ to indicate that the compare true data 520T received on the true compare bit line 521T does not match (e.g., is opposite binary polarity to) the stored true data 518T stored in the compare memory cell circuit 514. A time to discharge the row match line 512 depends on a capacitance $C_{512}$ of the row match line 512 and a current capacity of the true compare circuit 516T or the complement compare circuit 516C. The capacitance $C_{512}$ is determined, in part, by a length of the row match line 512 and a number of loads, such as transistors to which the row match line 512 is coupled or electrically connected.

The stored true data 518T is one bit of a binary tag BT stored in the row 510. The compare true data 520T is a bit of a compare tag CT that is provided for comparison to the binary tags BT stored in the CAM array 500. In other words, each of the binary tags BT is stored in a plurality of compare memory cell circuits 514 in a row 510. The number of bits of the binary tag BT may correspond to the number of columns 522 of compare memory cell circuits 514 of the CAM array 500. The true compare bit line 521T receives the compare true data 520T for the column 522 and a complement compare bit line 521C receives a compare complement data 520C complementary to the compare true data 520T.

Comparison of the compare tag CT to the binary tag BT in the row 510 and generation of an indication that the compare tag CT matches the binary tag BT are performed by a dynamic comparator circuit 524. The dynamic comparator circuit 524 includes a column compare circuit 526 that generates, for each column 522, the compare true data 520T on the true compare bit line 521T and the compare complement data 520C, complementary to the compare true data 520T, on the complement compare bit line 521C to the compare memory cell circuit 514 in each row 510. The compare true data 520T and the compare complement data 520C are generated based on a compare true bit 528T and a compare complement bit 528C, respectively, in response to activation of the clock signal CLK. The compare true bit 528T and a compare complement bit 528C indicate a bit of the compare tag CT.

As noted above, the CAM array 500 includes one decode column 502 for each set 504. The dynamic comparator circuit 524 includes a set clock circuit 530 that generates, to each decode column 502, a set clock signal 532 for addressing the corresponding set 504 (i.e., the set 504 corresponding to the decode column 502). The set clock signal 532 is generated based on the set address signal 506 in response to the clock signal CLK. The set clock signal 532 controls matching in a set 504. Specifically, the set clock signal 532 provided to each row 510 of a set 504 is employed to generate the set match signal 508. The dynamic comparator circuit 524 includes a row match circuit 534 that receives the set match signal 508 and the row match line 512. The row match circuit 534 generates, for each row 510, in response to the set match signal 508 and the row 510, a row match signal 536 indicating that the compare tag CT matches the binary tag BT stored in the row 510. The row match signal 536 corresponds to the hit signal 226 in FIG. 2.

The row match signal 536 is generated based on the row match line 512 and the set match signal 508. Both the match indication on the row match line 512 and the activation of the set match signal 508 are triggered by the clock signal CLK. A difference in the respective delays of these signals following activation of the clock signal CLK determines the timing margin. Thus, the delays are discussed individually below to explain reduction of the timing margin in the row match signal 536. The delay from activation of the clock signal CLK to the indication of a match on the row match line 512 depends on several factors.

Regarding a first factor, the compare complement data 520C is generated by the column compare circuit 526 based on the compare complement bit 528C in response to the clock signal CLK. The compare complement data 520C and the stored true data 518T are coupled to the true compare circuit 516T in each row 510. The true compare circuit 516T includes a stored data transistor 537T1 controlled by the stored true data 518T, and a compare data transistor 537T2 controlled by the compare complement data 520C. If both the stored true data 518T and the compare complement data 520C are at the same voltage (e.g., supply voltage $V_{DD}$) indicating that both are at a binary "1", which indicates a mismatch, both the stored data transistor 537T1 and the compare data transistor 537T2 are turned on and the row match line 512 is discharged. Additionally, complement compare circuit 516C includes a stored data transistor 537C1 controlled by the stored complement data 518C, and a compare data transistor 537C2 controlled by the compare true data 520T. If the stored complement data 518C and the compare true data 520T are both "1", indicating a mismatch, the complement compare circuit 516C is turned on to discharge the row match line 512.

Regarding a second factor, the propagation time of the compare true data 520T is determined, in part, by a number of rows 510 in the CAM array 500, which corresponds to a number of loads on a wire and a wire length. The compare true data 520T of each column 522 of compare memory cell circuits 514 is coupled to a true compare circuit 516T in each row 510. The compare complement data 520C has the same number of loads as the compare true data 520T.

Regarding a third factor, the time required to discharge the row match line 512, to indicate a mismatch, depends on the capacitance $C_{512}$, which depends on length and a number of loads on the row match line 512, which both depend on a number of compare memory cell circuits 514 in a row 510 (i.e., the number of columns 522 in the row 510). The discharge time also depends on the number of bits of the binary tag BT stored in the row 510 that don't match corresponding bits of the compare tag CT. A number of mismatching bits determines the number of true and complement compare circuits 516T and 516C that discharge the row match line 512 in parallel. The time to discharge the row match line 512 decreases with an increase of mismatched bits because more true compare circuits 516T or complement compare circuits 516C are turned on to discharge the row match line 512 in parallel.

The decode column 502 improves synchronization of the set match signal 508 to the match indication on the row match line 512. The three factors described above regarding delays of the row match line 512 are compared here to the corresponding factors of the set match signal 508.

First, the set clock signal 532 is generated by the set clock circuit 530 based on the set address signal 506 in response to activation of the clock signal CLK. The decode column 502 includes a pull-down circuit 538 corresponding to each row 510 of the CAM array 500. The set clock signal 532 controls a first transistor 540 of the pull-down circuit 538 to be turned on or turned off (e.g., conducting or not conducting) depending on a state of the set clock signal 532. The pull-down circuit 538 includes a second transistor 542 controlled by a constant voltage source (e.g., supply voltage $V_{DD}$ or ground voltage $V_{SS}$) such that the second transistor 542 is always turned on or always turned off.

Specifically, in the rows 510 of the set 504 corresponding to the decode column 502, the second transistor 542 is coupled to the supply voltage $V_{DD}$ such that the second transistor 542 remains turned on (i.e., conducting). In the rows 510 of sets 504 that do not correspond to the decode column 502, the second transistor 542 is coupled to the ground voltage $V_{SS}$ to keep the second transistor 542 turned off (i.e., not conducting). Thus, the pull-down circuits 538 in the rows 510 in the set 504 corresponding to the decode column 502 are controlled by the set clock signal 532. The pull-down circuits 538 in the rows 510 of other sets 504 not corresponding to the decode column 502 are always off regardless of a state of the set clock signal 532 coupled to the first transistor 540.

Second, propagation time of the set clock signal 532 is determined, in part, by the set clock signal 532 being provided to a load (i.e., the first transistor 540) in each of the rows 510. When the set clock signal 532 for a set 504 is activated, a set match line 544 for each row 510 in the set 504 is discharged. The set match signal 508 is generated on the set match line 544.

Third, the time required to discharge the set match line 544, to gate the row match line 512 of the same row 510, depends on the number of decode columns 502 because the set match line 544 is coupled to the pull-down circuit 538 in each decode column to increase the number of loads on the set match line 544, even though the pull-down circuit 538 in only one decode column 502 actually discharges the set match line. Comparing the set match line 544 to the row match line 512, the number of loads of the set match line 544 may be less than the number of columns 522 to which the row match line 512 is coupled, but this difference may be offset by the set match line 544 being greater in length than the row match line 512, which increases capacitance of the set match line 544.

The set match line 544 extends along the rows 504 and across the decode columns 502 located on an opposite end of the CAM array 500 from the row match circuit 534. A delay circuit 546 may be included in the row match circuit 534 to further increase delay of the set match line 544. In another aspect, the row match line 512 is coupled to a precharge circuit 548 and the set match line 544 is coupled to a precharge circuit 550.

As shown above, factors on which the delays of the match indication on the row match line 512 and the set match line 544 are made very similar by the addition the decode columns 502. Due to the similarities between the respective circuits, manufacturing and process variations tend to affect both delays to a similar extent. Therefore, the difference between the respective delays is reduced, which reduces the timing margin of the row match signal 536.

The decode columns 502 shown in FIG. 5 is implemented in a non-compare memory cell circuit 552 corresponding to the row 510. In a CAM array 500 including a plurality of rows 510, the decode column 502 would include a plurality of non-compare memory cell circuits 552, one corresponding to each row 510. A CAM array 500 including a plurality of sets 504 would include a decode column 502 corresponding to each set 504 and each of such decode columns 502 would include a non-compare memory cell circuit 552 corresponding to each row 510. Each decode column 502 would include a set clock circuit 530.

The non-compare memory cell circuit 552 is capable of storing stored data (e.g., one bit) that can be read by a read bit circuit 554 in response to a read word line RWL. Typically, information such as a process ID and/or parity bits are stored in the non-compare memory cell circuits 552 because they are not the subject of a comparison. The non-compare memory cell circuit 552 does not include true and complement compare circuits 516T and 516C found in the compare memory cell circuits 514. Thus, the decode column 502 can actually be implemented in the non-compare memory cell circuits 552 of the CAM array 500. The decode columns 502 can be incorporated into existing columns of non-compare memory cell circuits 552 with the addition of pull-down circuits 538, the set clock signal 532, and the set match line 544, as discussed with reference to FIGS. 6 and 7. In this manner, the decode columns 502 can be implemented in a CAM array 500 to reduce the timing margin of the row match signal 536 without an increase in size (i.e., area).

The first transistor 540 and the second transistor 542 in each of the pull-down circuits 538 may be, for example, metal-oxide semiconductor (MOS) field-effect transistors (FETs) (MOSFETs). The set clock signal 532 is coupled to a gate terminal of the first transistors 540 to control conductivity through the pull-down circuits 538. The set clock circuit 530 may logically AND the set address signal 506 and the clock signal CLK.

Figure 6:
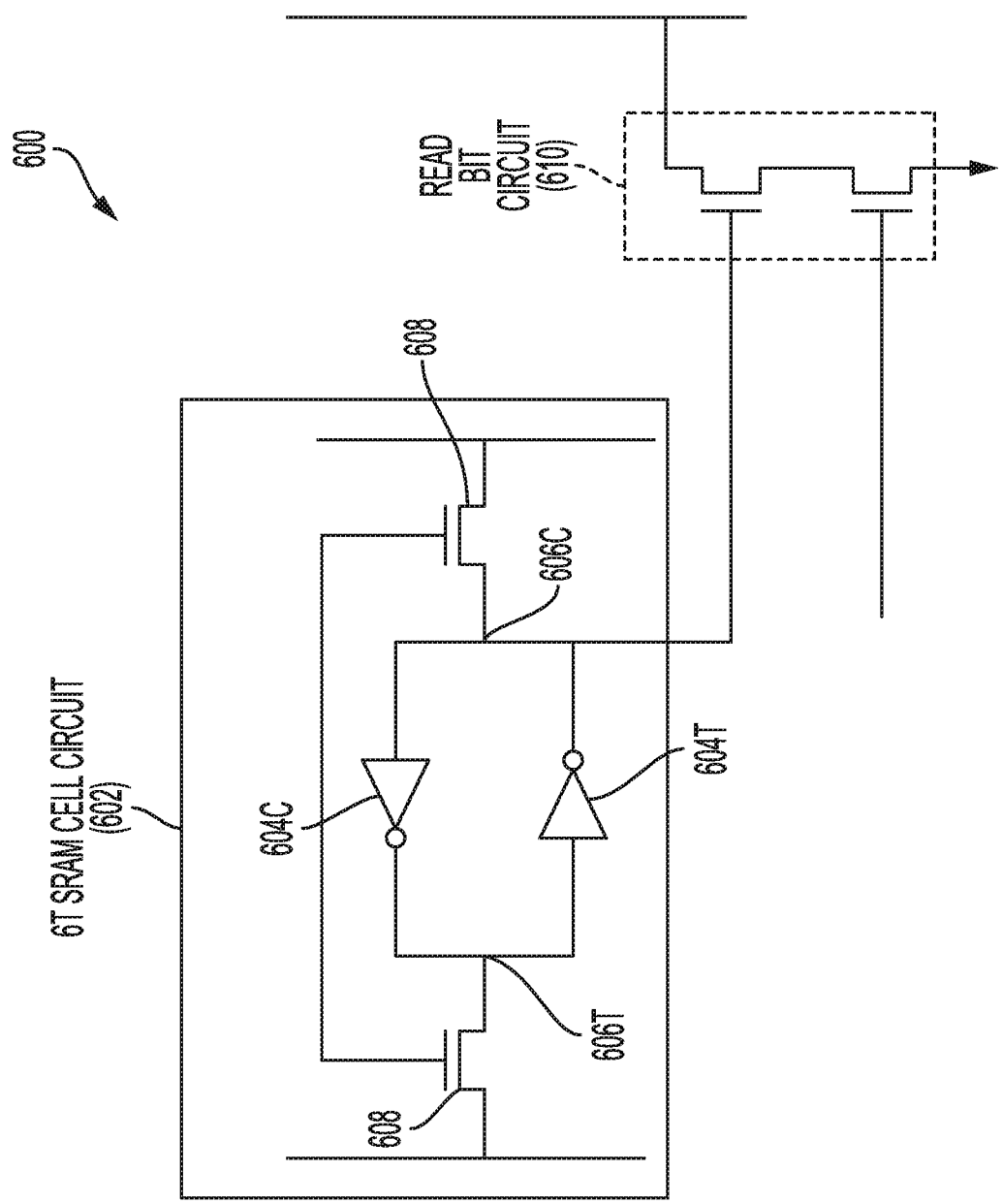
FIG. 6 is a schematic diagram of a non-compare memory cell circuit in a CAM array for storing data that is not the subject of a comparison.

FIG. 6 is a schematic diagram illustrating details of a non-compare memory cell circuit 600 in an example including a 6T SRAM cell circuit 602. The 6T SRAM cell circuit 602 includes cross-coupled inverters 604T and 604C providing a true storage node 606T and a complement storage node 606C. The true and complement storage nodes 606T and 606C are written via the pass-gates 608. In FIG. 6, the complement storage node 606C is read via a read bit circuit 610 like the read bit circuit 554 shown in FIG. 5. Further details of the 6T SRAM memory cell circuit 602 are beyond the scope of the present disclosure and are not presented here. Comparing the compare memory cell circuit 514 to the non-compare memory cell circuit 600, the read bit circuit 610 occupies an area of the non-compare memory cell circuit 600 that would be occupied by the complement compare circuit 516C in the compare memory cell circuit 514. The non-compare memory cell circuit 600 does not include another circuit coupled to the true storage node 606T, where the true compare circuit 516T is located in a compare memory cell circuit 514.

Figure 7:
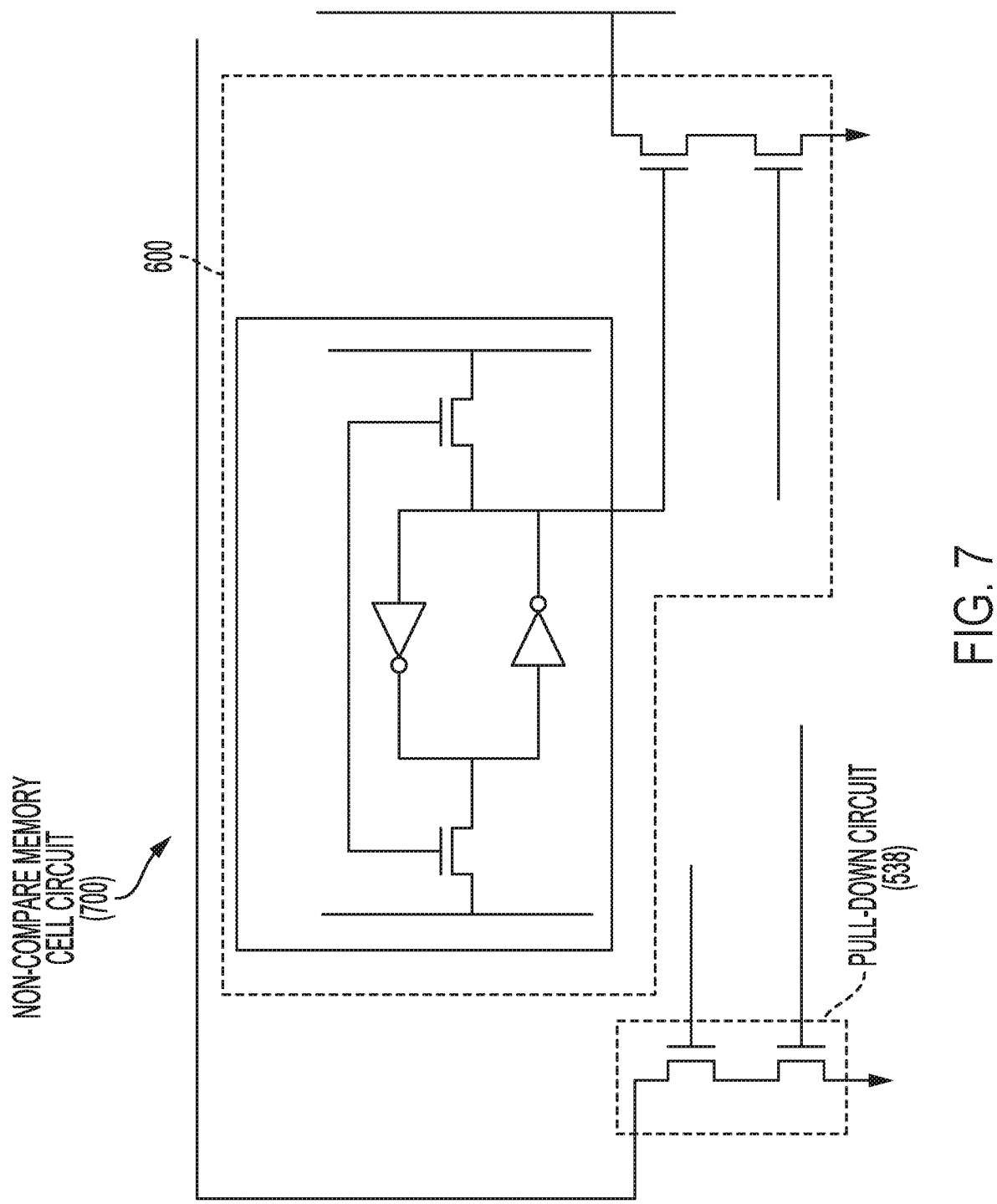
FIG. 7 is a schematic diagram of an exemplary modified non-compare memory cell circuit to form a circuit of the decode column corresponding to each row of compare memory cell circuits of the CAM array in FIG. 5.

FIG. 7 is a schematic diagram of a non-compare memory cell circuit 700 which includes the non-compare memory cell circuit 600 in FIG. 6 and the pull-down circuit 538 of FIG. 5. In this regard, implementing the decode column 502 shown in FIG. 5 includes merely adding the pull-down circuit 538 to the non-compare memory cell circuit 600 for a CAM array with a reduced timing margin and without an increase in area.

Figure 8:
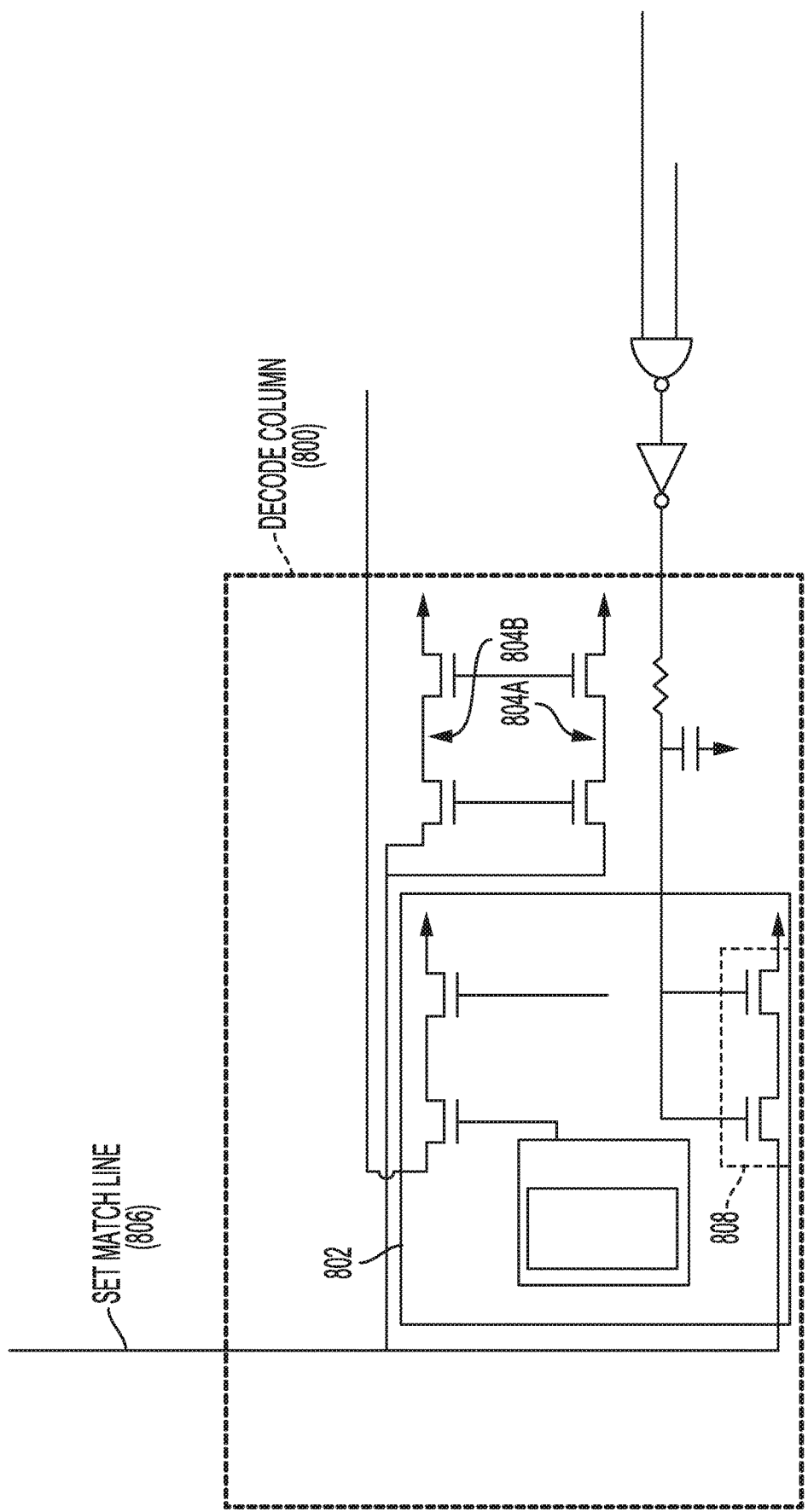
FIG. 8 is a schematic diagram of a CAM array including an alternative example of non-compare memory cell circuit in a decode column further modified to fine tune a delay of the set match signal with the row match line.

FIG. 8 is an example of a decode column 800 including a non-compare memory cell circuit 802 corresponding to the non-compare memory cell circuit 700 with the addition of pull-down circuits 804A and 804B coupled to a set match line 806. The set match line 806 corresponds to the set match line 544 in FIG. 5. The pull-down circuits 804A and 804B load the set match line 806 to match a load of the row match line 512 in FIG. 5. These additional loads providing a means of fine-tuning an increase in capacitance of the set match line 806 so propagation delays of the set match line 806 better correspond to propagation delays to the row match line 512, to further reduce a timing margin of a row match signal (not shown).

Figure 9:
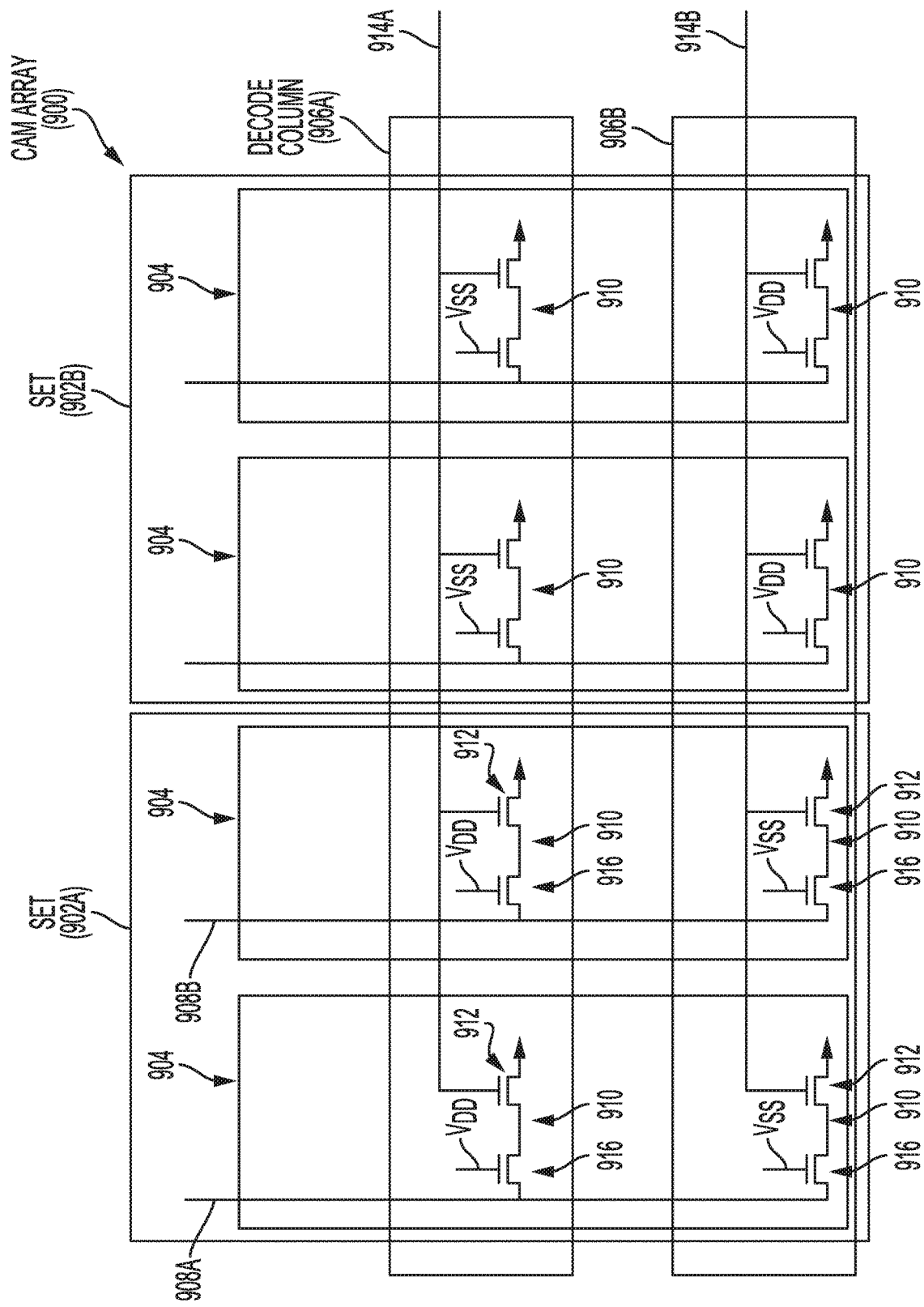
FIG. 9 is a schematic diagram of a CAM array in which decode columns are separate from the non-compare memory cell circuits.

FIG. 9 is a schematic diagram illustrating a CAM array 900 including set 902A and set 902B, with each of the sets 902A and 902B including two rows 904. Although not shown in FIG. 9, the rows 904 each include a plurality of compare memory cell circuits like the compare memory cell circuits 514 in FIG. 5 for storing bits of a binary tag BT. The CAM array 900 includes decode column 906A corresponding to the set 902A and decode column 906B corresponding to the set 902B. A set clock circuit (not shown) generates a set clock signal 908A for set 902A and a set clock signal 909A for set 902B. The pull-down circuits 910 corresponding to each of the rows 904 in the decode columns 906A and 906B receive the set match signals 908A and 908B, respectively. The pull-down circuits 910 may be included in non-compare memory cell circuits like the non-compare memory cell circuits 552 in FIG. 5 (not shown). Alternatively, the decode columns 906A and 906B may include only the pull-down circuits 910 in the CAM array 900 separate from the not shown compare memory cell circuits and non-compare memory cell circuits.

A first transistor 912 in each of the pull-down circuits 910 in the decode column 906A receives the set clock signal 908A indicating the set 902A is addressed. A first transistor 912 in each of the pull-down circuits 910 in the decode column 906B receives the set clock signal 908B indicating the set 902B is addressed. A second transistor 916 in each of the pull-down circuits 910 is coupled to a fixed voltage source. In rows 904 of the set 902A, the second transistors 916 in the decode column 906A are coupled to the supply voltage $V_{DD}$ such that the pull-down circuit 910 in the rows 904 of the set 902A are controlled by the set clock signal 908A. Similarly, in the rows 904 of the set 902B, the second transistors 916 in the decode column 906B are coupled to the supply voltage $V_{DD}$ so the pull-down circuit 910 in the rows 904 of the set 902B are controlled by the set clock signal 908B.

However, in the rows 904 of the set 902A, the second transistors 916 in the decode column 906B are coupled to the ground voltage $V_{SS}$ such that the pull-down circuit 910 in the rows 904 of the set 902A in the decode column 906B is always off. In the rows 904 of the set 902B, the second transistors 916 in the decode column 906A are also coupled to the ground voltage $V_{SS}$ to keep the pull-down circuit 910 in the rows 904 of the set 902B in the decode column 906A always turned off. That is, in the decode column 906A, each pull-down circuit 910 corresponding to each row 904 in the set 902A activates a set match line 918A or 920A in the row 904 in response to receiving the set clock signal 908A for the corresponding set 902A. In decode column 906B, each pull-down circuit 910 corresponding to a row 904 in the set 902B activates the set match signal 918B or 920B corresponding to the row 904 in response to receiving the set clock signal 908B for the corresponding set 902B. In decode column 906A, each pull-down circuit 910 corresponding to the rows 904 in the set 902B does not activate the set match signal 918A or 918B and, in the decode column 906B, the pull-down circuit 910 in each row 904 in the set 902A does not activate the set match signal 918B or 920B.

Even if the set clock signals 908A and 908B do not control certain pull-down circuits 910, the first transistors 912 to which they are coupled provide loads that contribute to a capacitance of the set clock signals 908A and 908B to better replicate the loads of the compare true data 520T and compare complement data 520C in FIG. 5 to help reduce the timing margin of the set match signal 508 and the row match line 512 in FIG. 5.

Figure 10:
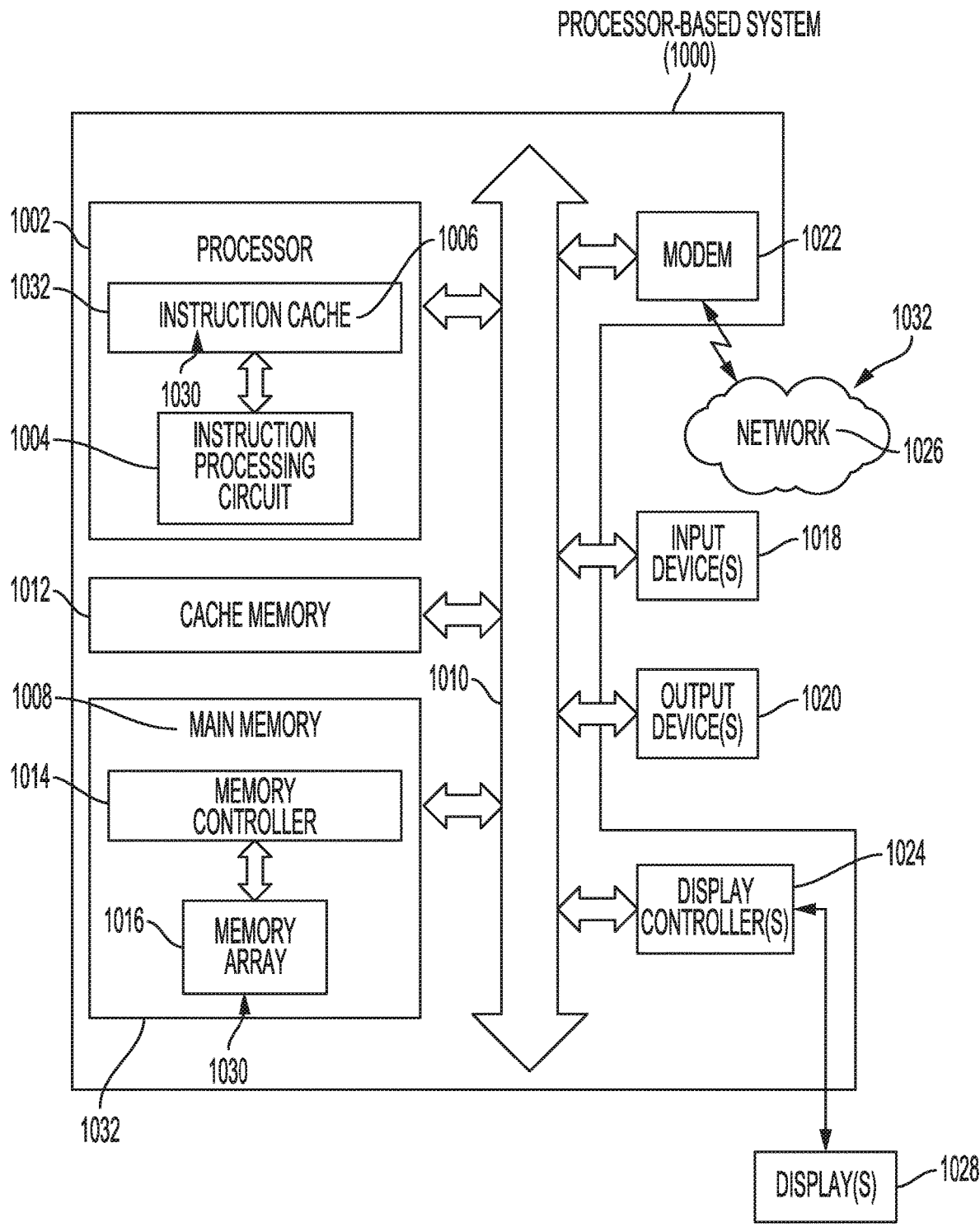
FIG. 10 is a block diagram of an exemplary processor-based system including a plurality of devices coupled to a system bus, wherein any CAM array in the processor-based system may be the CAM array in any of FIGS. 5, 8, and 9.

FIG. 10 is a block diagram of an exemplary processor-based system 1000 that includes a processor 1002 (e.g., a microprocessor) that includes an instruction processing circuit 1004. The processor-based system 1000 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 1000 includes the processor 1002. The processor 1002 represents one or more general-purpose processing circuits, such as a microprocessor, central processing unit, or the like. More particularly, the processor 1002 may be an EDGE instruction set microprocessor, or other processor implementing an instruction set that supports explicit consumer naming for communicating produced values resulting from execution of producer instructions. The processor 1002 is configured to execute processing logic in instructions for performing the operations and steps discussed herein. In this example, the processor 1002 includes an instruction cache 1006 for temporary, fast access memory storage of instructions accessible by the instruction processing circuit 1004. Fetched or prefetched instructions from a memory, such as from a main memory 1008 over a system bus 1010, are stored in the instruction cache 1006. Data may be stored in a cache memory 1012 coupled to the system bus 1010 for low-latency access by the processor 1002. The instruction processing circuit 1004 is configured to process instructions fetched into the instruction cache 1006 and process the instructions for execution.

The processor 1002 and the main memory 1008 are coupled to the system bus 1010 and can intercouple peripheral devices included in the processor-based system 1000. As is well known, the processor 1000 communicates with these other devices by exchanging address, control, and data information over the system bus 1010. For example, the processor 1002 can communicate bus transaction requests to a memory controller 1014 in the main memory 1008 as an example of a slave device. Although not illustrated in FIG. 10, multiple system buses 1010 could be provided, wherein each system bus constitutes a different fabric. In this example, the memory controller 1014 is configured to provide memory access requests to a memory array 1016 in the main memory 1008. The memory array 1020 is comprised of an array of storage bit cells for storing data. The main memory 1008 may be a read-only memory (ROM), flash memory, dynamic random access memory (DRAM), such as synchronous DRAM (SDRAM), etc., and a static memory (e.g., flash memory, static random access memory (SRAM), etc.), as non-limiting examples.

Other devices can be connected to the system bus 1010. As illustrated in FIG. 10, these devices can include the main memory 1008, one or more input device(s) 1018, one or more output device(s) 1020, a modem 1022, and one or more display controllers 1024, as examples. The input device(s) 1018 can include any type of input device, including but not limited to input keys, switches, voice processors, etc. The output device(s) 1020 can include any type of output device, including but not limited to audio, video, other visual indicators, etc. The modem 1022 can be any device configured to allow exchange of data to and from a network 1026. The network 1026 can be any type of network, including but not limited to a wired or wireless network, a private or public network, a local area network (LAN), a wireless local area network (WLAN), a wide area network (WAN), a BLUETOOTH™ network, and the Internet. The modem 1022 can be configured to support any type of communications protocol desired. The processor 1002 may also be configured to access the display controller(s) 1024 over the system bus 1010 to control information sent to one or more displays 1028. The display(s) 1028 can include any type of display, including but not limited to a cathode ray tube (CRT), a liquid crystal display (LCD), a plasma display, etc.

The processor-based system 1000 in FIG. 10 may include a set of instructions 1030 to be executed by the processor 1002 for any application desired according to the instructions. The instructions 1030 may be stored in the main memory 1008, processor 1002, and/or instruction cache 1006 as examples of a non-transitory computer-readable medium 1032. The instructions 1030 may also reside, completely or at least partially, within the main memory 1008 and/or within the processor 1002 during their execution. The instructions 1030 may further be transmitted or received over the network 1026 via the modem 1022, such that the network 1026 includes computer-readable medium 1032.

While the computer-readable medium 1036 is shown in an exemplary embodiment to be a single medium, the term "computer-readable medium" should be taken to include a single medium or multiple media (e.g., a centralized or distributed database, and/or associated caches and servers) that stores the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

Any ICs in the processor-based system 1000 may include a CAM array including decode columns corresponding to each set, each of the decode columns receiving a set address signal and generating a set match signal in each row of the set such that the set match signal and a match indication on a row match line are generated within a reduce timing margin, as illustrated in FIG. 5.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. An array of compare memory cell circuits comprising:
   at least one set, each set comprising at least one row of a plurality of rows of compare memory cell circuits, each row of the plurality of rows configured to store a binary tag;
   a plurality of columns of the compare memory cell circuits, each column of the plurality of columns comprising a compare memory cell circuit in each row of the plurality of rows;
   at least one decode column, each of the at least one decode column corresponding to a set of the at least one set, the at least one decode column configured to:
      receive a set clock signal for the corresponding set; and
      generate a set match signal on a set match line in each row of the corresponding set; and
   a dynamic comparator circuit comprising:
      a set clock circuit configured to generate, to each of the at least one decode column, the set clock signal for addressing the corresponding set;
      a column compare circuit configured to generate, for each column of the plurality of columns, a compare true data indicating a compare true bit of a compare tag;
      a row match circuit configured to generate, for each row of the plurality of rows, in response to the set match signal generated in the row, a row match signal indicating that the compare tag matches the binary tag stored in the row,
   wherein:
   each decode column of the at least one decode column comprises a pull-down circuit in each row of the plurality of rows of compare memory cell circuits, each pull-down circuit coupled to the set match line in the corresponding row; and
   in a decode column corresponding to a set of the at least one set:
      each pull-down circuit corresponding to a row in the set is configured to activate the set match line in the row in response to receiving the set clock signal for the corresponding set; and
      each pull-down circuit corresponding to a row in another set of the at least one set is configured to not activate the set match line in the row.

2. The array of compare memory cell circuits of claim 1, each row of the plurality of rows further comprising a row match line, wherein the row match circuit is further configured to generate the row match signal for the row in response to the row match line indicating the compare tag matches the binary tag stored in the row.

3. The array of compare memory cell circuits of claim 2, wherein each compare memory cell circuit is configured to store a stored true data corresponding to a compare true bit of the binary tag and a stored complement data complementary to the stored true data.

4. The array of compare memory cell circuits of claim 3, each compare memory cell circuit further comprising a true compare circuit coupled to:
   the row match line of the row comprising the compare memory cell circuit; and
   a true compare bit line configured to receive the compare true data for the column comprising the compare memory cell circuit;
   wherein the true compare circuit is configured to couple the row match line to a first voltage to indicate that the compare true data received on the true compare bit line does not match the stored true data stored in the compare memory cell circuit.

5. The array of compare memory cell circuits of claim 4, wherein:
   the column compare circuit is further configured to generate, for each column of the plurality of columns, a compare complement data complementary to the compare true data of the binary tag and indicating a compare complement bit of the compare tag; and
   each compare memory cell circuit further comprises a complement compare circuit configured to couple the row match line of the row comprising the memory cell circuit to the first voltage to indicate that the compare complement data for the column comprising the compare memory cell circuit does not match the stored complement data stored in the compare memory cell circuit.

6. The array of compare memory cell circuits of claim 5, the complement compare circuit further comprising a third transistor controlled by the stored complement data stored in the compare memory cell circuit and a fourth transistor controlled by the compare true data for the column comprising the compare memory cell circuit.

7. The array of compare memory cell circuits of claim 4, the true compare circuit further comprising a first transistor controlled by the stored true data stored in the compare memory cell circuit and a second transistor controlled by the compare complement data for the column comprising the compare memory cell circuit.

8. The array of compare memory cell circuits of claim 3, wherein each of the compare memory cell circuits comprise a static random-access memory (SRAM) cell circuit.

9. The array of compare memory cell circuits of claim 1, the set clock circuit is further configured to generate, to each of the at least one decode column, the set clock signal in response to a clock signal and a set address signal corresponding to the set.

10. The array of compare memory cell circuits of claim 1, the column compare circuit is further configured to generate, for each column of the plurality of columns, the compare true data based on the compare true bit of the binary tag in response to the clock signal.

11. The array of compare memory cell circuits of claim 1, wherein:
each decode column is configured to receive the set clock signal for the corresponding set generated by the set clock circuit; and
each pull-down circuit comprises a first transistor controlled by the set clock signal and a second transistor coupled to a fixed voltage source.

12. The array of compare memory cell circuits of claim 11, wherein:
in each row in the corresponding set, the voltage source comprises a supply voltage VDD; and
in each row not in the corresponding set, the voltage source comprises a ground voltage Vss.

13. The array of compare memory cell circuits of claim 11, wherein:
each decode column further comprises, in each row, a non-compare memory cell circuit coupled to a read bit line, the non-compare memory cell circuit comprising:
a memory cell circuit; and
a read transistor circuit configured to read a stored data stored in the non-compare memory cell circuit in response to activation of a read word signal.

14. An integrated circuit comprising an array of compare memory cell circuits, the array of compare memory cell circuits comprising:
at least one set, each set comprising at least one row of a plurality of rows of compare memory cell circuits, each row of the plurality of rows configured to store a binary tag;
a plurality of columns of the compare memory cell circuits, each column of the plurality of columns comprising a compare memory cell circuit in each row of the plurality of rows;
at least one decode column, each of the at least one decode column corresponding to a set of the at least one set, the at least one decode column configured to:
receive a set clock signal for the corresponding set; and
generate a set match signal on a set match line in each row of the corresponding set; and
a dynamic comparator circuit comprising:
a set clock circuit configured to generate, to each of the at least one decode column, the set clock signal for addressing the corresponding set;
a column compare circuit configured to generate, for each column of the plurality of columns, a compare true data indicating a compare true bit of a compare tag; and
a row match circuit configured to generate, for each row of the plurality of rows, in response to the set match signal generated in the row, a row match signal indicating that the compare tag matches the binary tag stored in the row,
wherein:
each decode column of the at least one decode column comprises a pull-down circuit in each row of the plurality of rows of compare memory cell circuits, each pull-down circuit coupled to the set match line in the corresponding row; and
in a decode column corresponding to a set of the at least one set:
each pull-down circuit corresponding to a row in the set is configured to activate the set match line in the row in response to receiving the set clock signal for the corresponding set; and
each pull-down circuit corresponding to a row in another set of the at least one set is configured to not activate the set match line in the row.

15. The integrated circuit of claim 14, each row of the plurality of rows further comprising a row match line, wherein the row match circuit is further configured to generate the row match signal for the row in response to the row match line indicating the compare tag matches the binary tag stored in the row.

16. The integrated circuit of claim 15, wherein each compare memory cell circuit is configured to store a stored true data corresponding to a compare true bit of the binary tag and a stored complement data complementary to the stored true data.

17. The integrated circuit of claim 16, each compare memory cell circuit further comprising a true compare circuit coupled to:
the row match line of the row comprising the compare memory cell circuit; and
a true compare bit line configured to receive the compare true data for the column comprising the compare memory cell circuit;
wherein the true compare circuit is configured to couple the row match line to a first voltage to indicate that the compare true data received on the true compare bit line does not match the stored true data stored in the compare memory cell circuit.

18. The integrated circuit of claim 17, wherein:
the column compare circuit is further configured to generate, for each column of the plurality of columns, a compare complement data complementary to the compare true data of the binary tag and indicating a compare complement bit of the compare tag; and
each compare memory cell circuit further comprises a complement compare circuit configured to couple the row match line of the row comprising the memory cell circuit to the first voltage to indicate that the compare complement data for the column comprising the compare memory cell circuit does not match the stored complement data stored in the compare memory cell circuit.

19. The integrated circuit of claim 17, the true compare circuit further comprising a first transistor controlled by the stored true data stored in the compare memory cell circuit and a second transistor controlled by the compare complement data for the column comprising the compare memory cell circuit.

20. The integrated circuit of claim 19, the complement compare circuit further comprising a third transistor controlled by the stored complement data stored in the compare memory cell circuit and a fourth transistor controlled by the compare true data for the column comprising the compare memory cell circuit.

21. An array of compare memory cell circuits comprising:
- at least one set, each set comprising at least one row of a plurality of rows of compare memory cell circuits, each row of the plurality of rows configured to store a binary tag;
- a plurality of columns of the compare memory cell circuits, each column of the plurality of columns comprising a compare memory cell circuit in each row of the plurality of rows;
- at least one decode column, each of the at least one decode column corresponding to a set of the at least one set, the at least one decode column configured to:
  - receive a set clock signal for the corresponding set; and
  - generate a set match signal on a set match line in each row of the corresponding set; and
- a dynamic comparator circuit comprising:
  - a set clock circuit configured to generate, to each of the at least one decode column, the set clock signal for addressing the corresponding set;
  - a column compare circuit configured to generate, for each column of the plurality of columns, a compare true data indicating a compare true bit of a compare tag;
  - a row match circuit configured to generate, for each row of the plurality of rows, in response to the set match signal generated in the row, a row match signal indicating that the compare tag matches the binary tag stored in the row,
- wherein, in each of the at least one decode columns:
  - the set clock signal is coupled to a load in each row of each set of the array; and
  - the load in each row of the set corresponding to the decode column comprises a circuit controlling the set match signal.

22. The array of compare memory cell circuits of claim 21, each row of the plurality of rows further comprising a row match line, wherein the row match circuit is further configured to generate the row match signal for the row in response to the row match line indicating the compare tag matches the binary tag stored in the row.

23. The array of compare memory cell circuits of claim 22, wherein each compare memory cell circuit is configured to store a stored true data corresponding to a compare true bit of the binary tag and a stored complement data complementary to the stored true data.

24. The array of compare memory cell circuits of claim 23, each compare memory cell circuit further comprising a true compare circuit coupled to:
- the row match line of the row comprising the compare memory cell circuit; and
- a true compare bit line configured to receive the compare true data for the column comprising the compare memory cell circuit;
- wherein the true compare circuit is configured to couple the row match line to a first voltage to indicate that the compare true data received on the true compare bit line does not match the stored true data stored in the compare memory cell circuit.

25. The array of compare memory cell circuits of claim 24, wherein:
- the column compare circuit is further configured to generate, for each column of the plurality of columns, a compare complement data complementary to the compare true data of the binary tag and indicating a compare complement bit of the compare tag; and
- each compare memory cell circuit further comprises a complement compare circuit configured to couple the row match line of the row comprising the memory cell circuit to the first voltage to indicate that the compare complement data for the column comprising the compare memory cell circuit does not match the stored complement data stored in the compare memory cell circuit.

26. The array of compare memory cell circuits of claim 25, the complement compare circuit further comprising a third transistor controlled by the stored complement data stored in the compare memory cell circuit and a fourth transistor controlled by the compare true data for the column comprising the compare memory cell circuit.

27. The array of compare memory cell circuits of claim 24, the true compare circuit further comprising a first transistor controlled by the stored true data stored in the compare memory cell circuit and a second transistor controlled by the compare complement data for the column comprising the compare memory cell circuit.

28. The array of compare memory cell circuits of claim 21, the set clock circuit is further configured to generate, to each of the at least one decode column, the set clock signal in response to a clock signal and a set address signal corresponding to the set.

29. The array of compare memory cell circuits of claim 21, the column compare circuit is further configured to generate, for each column of the plurality of columns, the compare true data based on the compare true bit of the binary tag in response to the clock signal.

30. An array of compare memory cell circuits comprising:
- at least one set, each set comprising at least one row of a plurality of rows of compare memory cell circuits, each row of the plurality of rows configured to store a binary tag;
- a plurality of columns of the compare memory cell circuits, each column of the plurality of columns comprising a compare memory cell circuit in each row of the plurality of rows;
- at least one decode column, each of the at least one decode column corresponding to a set of the at least one set, the at least one decode column configured to:
  - receive a set clock signal for the corresponding set; and
  - generate a set match signal on a set match line in each row of the corresponding set; and
- a dynamic comparator circuit comprising:
  - a set clock circuit configured to generate, to each of the at least one decode column, the set clock signal for addressing the corresponding set;
  - a column compare circuit configured to generate, for each column of the plurality of columns, a compare true data indicating a compare true bit of a compare tag; and
  - a row match circuit comprising a delay circuit configured to generated a delayed set match signal based on the set match signal generated in the row, wherein the row match circuit is configured to generate, for each row of the plurality of rows, in response to the delayed set match signal, a row match signal indicating that the compare tag matches the binary tag stored in the row.

31. The array of compare memory cell circuits of claim 30, each row of the plurality of rows further comprising a row match line, wherein the row match circuit is further configured to generate the row match signal for the row in response to the row match line indicating the compare tag matches the binary tag stored in the row.

32. The array of compare memory cell circuits of claim 31, wherein each compare memory cell circuit is configured to store a stored true data corresponding to a compare true bit of the binary tag and a stored complement data complementary to the stored true data.

33. The array of compare memory cell circuits of claim 32, each compare memory cell circuit further comprising a true compare circuit coupled to:
  the row match line of the row comprising the compare memory cell circuit; and
  a true compare bit line configured to receive the compare true data for the column comprising the compare memory cell circuit;
  wherein the true compare circuit is configured to couple the row match line to a first voltage to indicate that the compare true data received on the true compare bit line does not match the stored true data stored in the compare memory cell circuit.

34. The array of compare memory cell circuits of claim 33, wherein:
  the column compare circuit is further configured to generate, for each column of the plurality of columns, a compare complement data complementary to the compare true data of the binary tag and indicating a compare complement bit of the compare tag; and
  each compare memory cell circuit further comprises a complement compare circuit configured to couple the row match line of the row comprising the memory cell circuit to the first voltage to indicate that the compare complement data for the column comprising the compare memory cell circuit does not match the stored complement data stored in the compare memory cell circuit.

35. The array of compare memory cell circuits of claim 34, the complement compare circuit further comprising a third transistor controlled by the stored complement data stored in the compare memory cell circuit and a fourth transistor controlled by the compare true data for the column comprising the compare memory cell circuit.

36. The array of compare memory cell circuits of claim 33, the true compare circuit further comprising a first transistor controlled by the stored true data stored in the compare memory cell circuit and a second transistor controlled by the compare complement data for the column comprising the compare memory cell circuit.

37. The array of compare memory cell circuits of claim 30, the set clock circuit is further configured to generate, to each of the at least one decode column, the set clock signal in response to a clock signal and a set address signal corresponding to the set.

38. The array of compare memory cell circuits of claim 30, the column compare circuit is further configured to generate, for each column of the plurality of columns, the compare true data based on the compare true bit of the binary tag in response to the clock signal.

* * * * *